(12) United States Patent
Meiler et al.

(10) Patent No.: US 12,331,391 B2
(45) Date of Patent: Jun. 17, 2025

(54) WORKPIECE CARRIER DEVICE, METHOD FOR COATING A WORKPIECE, AND WORKPIECE

(71) Applicant: OERLIKON SURFACE SOLUTIONS AG, PFÄFFIKON, Pfäffikon (CH)

(72) Inventors: Rudolf Meiler, Schiers (CH); Hubert Eberle, Planken (LI); Peter Naeff, Schaan (LI)

(73) Assignee: OERLIKON SURFACE SOLUTIONS AG, PFAFFIKON, Pfaffikon (CH)

(*) Notice: Subject to any disclaimer, the term of this patent is extended or adjusted under 35 U.S.C. 154(b) by 401 days.

(21) Appl. No.: 17/604,579

(22) PCT Filed: Apr. 17, 2020

(86) PCT No.: PCT/EP2020/060880
§ 371 (c)(1),
(2) Date: Oct. 18, 2021

(87) PCT Pub. No.: WO2020/212582
PCT Pub. Date: Oct. 22, 2020

(65) Prior Publication Data
US 2022/0195587 A1 Jun. 23, 2022

(30) Foreign Application Priority Data
Apr. 17, 2019 (DE) .................. 10 2019 110 158.1

(51) Int. Cl.
*C23C 14/50* (2006.01)
*C23C 14/06* (2006.01)
*C23C 28/04* (2006.01)

(52) U.S. Cl.
CPC ........ *C23C 14/505* (2013.01); *C23C 14/0635* (2013.01); *C23C 14/0641* (2013.01); *C23C 28/046* (2013.01)

(58) Field of Classification Search
CPC .............. C23C 14/505; C23C 14/0635; C23C 14/0641; C23C 28/046; C23C 8/24;
(Continued)

(56) References Cited

U.S. PATENT DOCUMENTS 7,588,640 B2 * 9/2009 Esser .................... C23C 14/505
269/57
9,115,426 B2 * 8/2015 Kolev .................. C23C 16/0272
(Continued)

FOREIGN PATENT DOCUMENTS

CN 101253281 A 8/2008
CN 101827955 A 9/2010
(Continued)

OTHER PUBLICATIONS

Translation (Year: 2016).*
(Continued)

*Primary Examiner* — Jeffrie R Lund
(74) *Attorney, Agent, or Firm* — PEARL COHEN ZEDEK LATZER BARATZ LLP

(57) ABSTRACT

The invention relates to a workpiece carrier device (1) for holding and moving workpieces (15), having: a workpiece carrier (2) for receiving workpieces (15), which is mounted on a main frame (4) so as to rotate about an axis (3); a drive part, which can likewise rotate about the axis (3) relative to the workpiece carrier (2); and multiple workpiece holders (5), which are arranged on the workpiece carrier (2) in a ring around the drive axis and are mounted on the workpiece carrier (2) so as to rotate about holder axes (6) which are spaced from the drive axis. The holder axes (6) run in such a way in relation to the axis (3) that the workpiece holders (5) form a conical crown arrangement (7). The invention further relates to a coating method using the workpiece carrier device (1) according to the invention and to work- (Continued)

pieces or substrates (15) coated by means of the coating method (e.g, pins, pen injectors, balls, ball pins, pistons, nozzle needles etc.).

21 Claims, 4 Drawing Sheets

(58) Field of Classification Search
CPC .... C23C 8/26; C23C 8/36; C23C 8/38; C23C 28/04; C23C 28/042
See application file for complete search history.

(56) References Cited

U.S. PATENT DOCUMENTS

| | | | |
|---|---|---|---|
| 2002/0094383 A1 | 7/2002 | Zaech et al. | |
| 2006/0265926 A1* | 11/2006 | Sietsema | C23C 28/34 |
| | | | 42/76.02 |
| 2007/0057138 A1 | 3/2007 | Esser | |
| 2008/0102291 A1 | 1/2008 | Hattiangadi et al. | |
| 2010/0270722 A1 | 10/2010 | Esser et al. | |
| 2011/0083604 A1 | 4/2011 | Esser et al. | |
| 2013/0004756 A1 | 1/2013 | Kennedy et al. | |
| 2013/0209767 A1 | 8/2013 | Kolev et al. | |
| 2014/0008857 A1 | 1/2014 | Esser | |
| 2017/0122249 A1 | 5/2017 | Procopio et al. | |
| 2022/0195587 A1* | 6/2022 | Meiler | C23C 28/042 |
| 2023/0234785 A1* | 7/2023 | Meiler | B65G 47/1407 |
| | | | 198/382 |

FOREIGN PATENT DOCUMENTS

| | | | | |
|---|---|---|---|---|
| CN | 102057075 A | | 5/2011 | |
| CN | 102747324 A | * | 10/2012 | ............. C01B 31/02 |
| CN | 102770584 A | | 11/2012 | |
| DE | 20 2004 009 256 U1 | | 9/2004 | |
| DE | 10 2004 027 989 A1 | | 3/2006 | |
| DE | 20 2006 015 522 U1 | | 2/2008 | |
| DE | 102010052971 A1 | * | 5/2012 | ......... C23C 14/0057 |
| DE | 102014217040 A1 | * | 3/2016 | ........... C23C 14/024 |
| EP | 1 153 155 B1 | | 1/2005 | |
| EP | 1 917 380 B1 | | 3/2009 | |
| EP | 2 628 817 A1 | | 8/2013 | |
| EP | 2 545 202 B1 | | 9/2014 | |
| EP | 3 186 408 | | 7/2019 | |
| FR | 2545043 A1 | * | 11/1984 | |
| JP | 2000082741 A | * | 3/2000 | ........ H01L 21/02115 |
| JP | 2005060766 A | * | 3/2005 | |
| JP | 2013091823 A | | 5/2013 | |
| WO | WO2009099226 A1 | * | 6/2011 | |
| WO | WO-2016156601 A1 | * | 10/2016 | ......... B05B 13/0221 |

OTHER PUBLICATIONS

Translation (Year: 1984).*
Translation (Year: 2005).*
Translation (Year: 2000).*
Translation (Year: 2012).*
Translation (Year: 2011).*
Office Action for Indian Patent Application No. 202117052425, dated Feb. 21, 2023.
Office Action for Chinese Patent Application No. 202080036882.0, dated Mar. 3, 2023.
International Search Report of PCT Application No. PCT/EP2020/060880, mailed May 27, 2020.

* cited by examiner

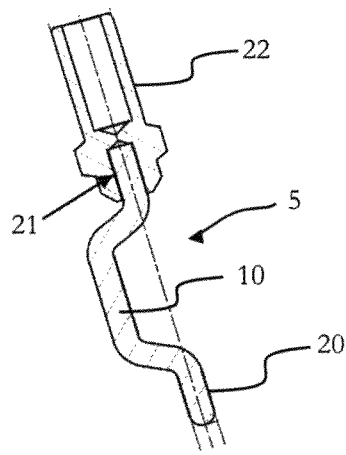
Fig. 4
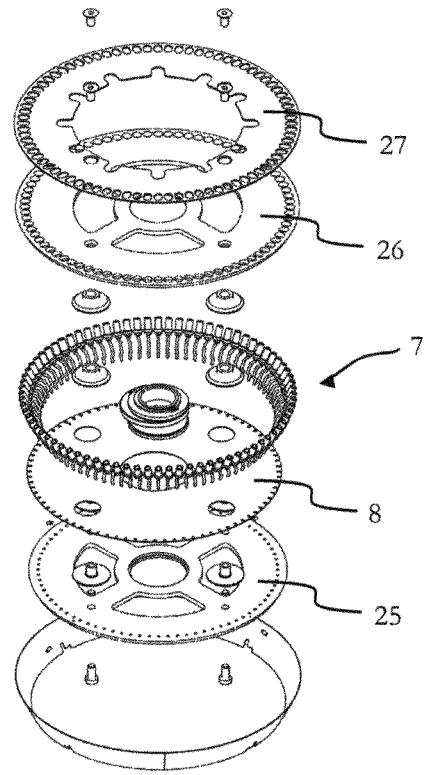
Fig. 5
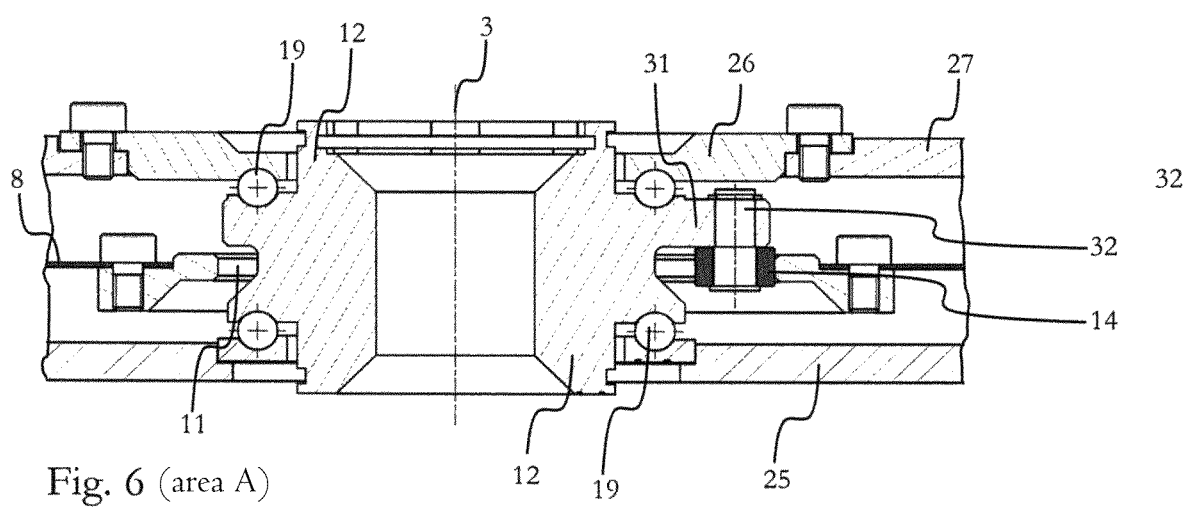
Fig. 6 (area A)

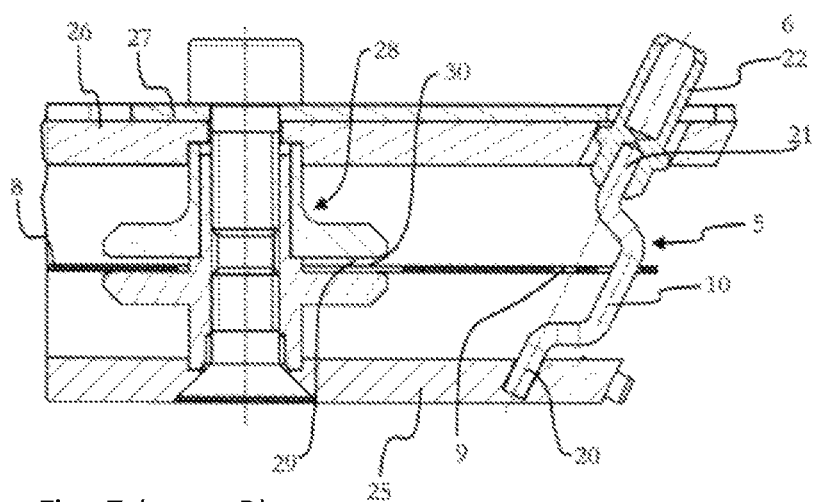
Fig. 7 (area B)
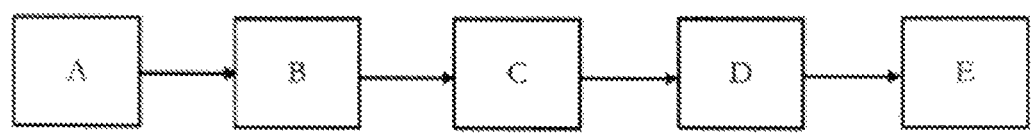
Fig. 8

WORKPIECE CARRIER DEVICE, METHOD FOR COATING A WORKPIECE, AND WORKPIECE

CROSS-REFERENCE TO RELATED APPLICATIONS

This application is a National Phase Application of PCT International Application No. PCT/EP2020/060880, International Filing Date Apr. 17, 2020, claiming priority of German Patent Application No. 10 2019 110 158.1, filed Apr. 17, 2019, which is hereby incorporated by reference.

FIELD OF THE INVENTION

The present disclosure relates to a workpiece carrier device for moving workpieces (substrates) having: a workpiece carrier for receiving workpieces, which is mounted on a main frame so as to rotate about an axis, a drive part which can likewise rotate about the axis relative to the workpiece carrier, and multiple workpiece holders which are arranged on the workpiece carrier in a ring around the drive axis and are mounted on the workpiece carrier so as to rotate about holder axes which are spaced from the drive axis. The invention further relates to a method for coating a workpiece in a workpiece carrier device of this type and to a workpiece.

BACKGROUND OF THE INVENTION

Workpiece carrier devices of this type are used for processing workpieces, above all in vacuum systems, and in particular for coating the workpieces in vacuum systems. They are used to move the workpieces on a workpiece carrier unit in a coating chamber to ensure uniform coating of all exposed surfaces of the workpieces in the coating chamber. The workpiece carrier units are here particularly suitable for moving cylindrical or pin-shaped workpieces (for example drills, nozzle needles or the like) in a coating chamber. In this case, the workpieces are arranged in a crown or ring around an axis of rotation and are moved around the axis of rotation in the coating chamber. In order to achieve the uniform coating of all surfaces, in particular the cylindrical circumferential surfaces, the workpieces are arranged for this purpose in rotatable holders which rotate about their own axis, i.e. the holder axis. During coating, the workpieces thus move around the axis of rotation and around their own longitudinal axis which is substantially coaxial with the holder axis. In this way, all surfaces are coated uniformly.

A workpiece carrier device of this type is shown e.g. in EP 1 917 380 B1. In this arrangement, the holder axes run parallel to the drive axis. Similar workpiece carrier devices are known from EP 1 153 155 A1, from US 2014/0008857 A1 and from DE 108 03 278 A1.

However, the difficulty of the known workpiece carrier devices in which the holder axis runs parallel to the drive axis, is that too little coating can be applied to workpieces with pronounced tip or a pronounced apex in these areas since these apices do not move or remain at one point during rotation about the holder axis. This can lead to insufficient coating in this area. A further problem with the known workpiece carrier devices is that with long workpieces the number of stacked workpiece sets (workpiece crowns) or with comparatively long workpieces the number of workpiece carriers, which can be arranged in a coating chamber, is limited and that only a comparatively small number of workpieces can be processed or coated in one batch.

DE 20 2004 009 256 U1 discloses a conical crown arrangement of the workpieces, in which the workpieces are rotated stepwise about their holder axes. This can make uniform coating in critical areas difficult.

The object of the present invention is therefore to provide an improved workpiece carrier device in which these disadvantages are at least partially reduced.

SUMMARY OF THE INVENTION

According to a first aspect, the present invention provides a workpiece carrier device for moving workpieces, having: a workpiece carrier for receiving workpieces, which is mounted on a main frame so as to rotate about an axis, a drive part which can likewise rotate about the axis relative to the workpiece carrier; and multiple workpiece holders which are arranged on the workpiece carrier in a ring around the drive axis and are mounted on the workpiece carrier so as to rotate about holder axes which are spaced from the drive axis, characterized in that the holder axes run in relation to the axis in such a way that the workpiece holders form a conical crown arrangement and the drive part comprises a crank disk having link slots which are arranged on the circumference and in each of which a drive portion of the workpiece holders runs via which the workpiece holders are set in rotary motion during operation.

Further aspects and features of the present invention result from the dependent claims, the attached drawing and the following description of preferred embodiments.

BRIEF DESCRIPTION OF THE DRAWING

Embodiments of the invention are now described by way of example and with reference to the attached drawing, wherein:

FIG. 4 shows a sectional view of a workpiece holder;

FIG. 5 shows an exploded view of the workpiece carrier device illustrated in FIG. 2;

FIG. 6 shows an enlarged sectional view of area A illustrated in FIG. 2;

FIG. 7 shows an enlarged diagram of area B illustrated in FIG. 2; and

FIG. 8 shows a schematic flow chart of a method according to the invention.

DESCRIPTION OF EMBODIMENTS

Figure 1:
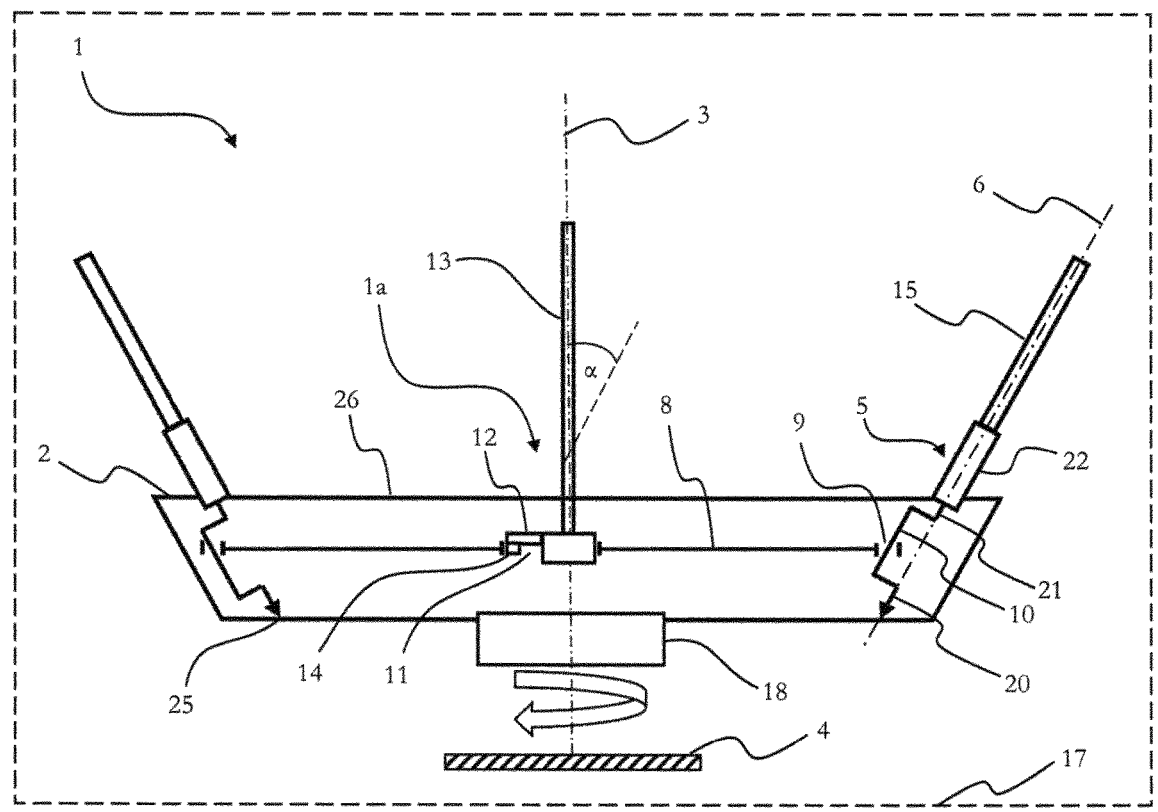
FIG. 1 shows a schematic axial sectional view through a workpiece carrier device according to the invention correspondent to a first embodiment.

FIG. 1 illustrates an embodiment in accordance with the present invention. General explanations on the embodiments are initially provided, followed by a detailed description.

The present disclosure also relates to a workpiece carrier device having a workpiece carrier including a rotary frame mounted on a main frame so as to rotate about a drive axis, a drive part which can likewise rotate about the drive axis relative to the rotary frame, as well as multiple workpiece holders which are spaced from the drive axis and are mounted on the rotary frame so as to rotate about holder axes.

The coating behavior is improved in a workpiece carrier device including a workpiece carrier, in which the holder axes run in relation to the axis in such a way that the workpiece holders—and the workpieces arranged in them—form conical crown or ring arrangements.

An elongate, compact or pin-shaped workpiece or substrate (e.g. pin, injection pin, ball, ball pin, piston or a nozzle needle), which is arranged in the workpiece holder and which has a pronounced (e.g. flat, roof- or dome-shaped) apex area protrudes obliquely to the axis and pointing outwards into the coating chamber. Due to the auto-rotation of the workpiece holder about its axis of rotation or about its holder axis, the absolutely highest apices move along a ring about the holder axis in the apex area of the workpiece through the coating chamber, so that there is no pronounced apex and a more uniform coating of the apex area can be achieved. In the case of a dome-shaped apex area, the relative apex is here laterally below the absolute apex at the point at which the holder axes and/or axes of rotation, which run obliquely to the drive axis, penetrate the end of the workpiece in each case. When coating with one or more layers, homogeneous coating of the apex area is ensured in the revolution of the cylinder of a piston or pin due to the permanent rotation. In a conventional workpiece carrier device, in which the holder axes run parallel to the axis of rotation of the workpiece carrier, on the other hand, the apex or apex area always remains at the same highest position (as a point or area) and is therefore only coated unevenly or insufficiently in some circumstances. Even if the holder axes run obliquely, but no uniform rotation about the holder axes is realized, the coating is not homogeneous, in particular in the apex area, in some circumstances.

Furthermore, the conical crown arrangement of the holder axes allows a more compact arrangement of a plurality of workpiece carriers to one another. In fact, the workpiece carriers can be stacked inside one another in such a way that, in the case of a stack of multiple workpiece carriers, the crown arrangement in each case forms a truncated edge into which the next workpiece carrier fits with its workpieces. In this way, the workpiece carriers can be compactly arranged into one another or one on top of the other, largely irrespective of the length of the workpieces to be arranged therein, and a large number of workpieces can be arranged in the tightest of spaces and be coated in a relatively compact coating chamber.

The holding axes here form an angle of between 5° and 45°, of between 15° and 35° and in particular of 25° with the axis. This results in a cone angle of between 10° and 90°, of between 30 and 70° or of 50°. An angle of 50° has proved particularly suitable since it represents a good compromise between the necessary inclination of the holder axis to improve the coating result and the possible inclination of the holder axis, at which the rotation of the workpiece holders about the holder axis is possible.

The drive of the tool holders, which is used to set them in rotation about their own holder axis, is carried out via a crank disk with link slots which are arranged on the circumference and each of which engages on a drive portion of the workpiece holders, which run inside the link slots. During the operation of the workpiece carrier device, the workpiece holder or workpiece holders rotate relative to a drive element which sets the crank disk in an eccentric oscillating movement relative to the workpiece carrier and in so doing drives the drive portions of the workpiece holders via the link slots in such a way that they set the workpiece holders in auto-rotation. The crank disk here performs a wobbling motion within the workpiece holder in a plane perpendicular to the axis and in so doing simultaneously moves all drive portions of the workpiece holders in the respective link slots.

Here, the link slots are designed as elongate oblong holes that are oriented radially to the axis. During operation, the drive portions of the workpiece holders here perform a sliding rolling motion along the inner edges of the oblong holes.

The drive is performed via a drive cam which is rotatable relative to the crank disk and which engages in a drive opening of the crank disk, so that it is moved normal to the axis during operation and carries out the rotary motion of the workpiece holders via the link slots. In this case, the drive cam describes a circular movement, with the outer edge of the drive cam defining a circle that is larger than the also circular drive opening of the crank disk. The wobbling or crank motion of the crank disk during the operation of the circulatory drive cam precisely corresponds to the amount of the difference between the cam radius and the opening radius of the drive opening.

In one embodiment in which the drive cam exerts its driving action via a drive roller which is rotatably mounted eccentrically to the axis and which during operation circulates at the edge of the drive opening of the crank disk, the wobbling motion is transmitted to the crank disk with particularly low friction.

There are embodiments in which each of the workpiece holders has a crank-like design and comprises a crank portion which runs between two coaxially extending end portions, one of which is rotatably mounted as a bearing end in a bearing point of the workpiece carrier and the other is rotatably arranged as a receiving end in a bearing opening of the workpiece carrier. The crank portion here forms the drive portion which interacts with the link slots or the oblong holes and which, during operation, i.e. when the crank disk is driven, performs a reciprocating movement in these link slots and in so doing exerts the rotary motion about the holder axis. Due to the double bearing, however, the workpiece holders are rotatably mounted in the workpiece carrier in a stable manner.

In one embodiment, the bearing point is in this case arranged in a bottom disk of the workpiece carrier—e.g., in the form of a conical recess or a round recess in which the end of the bearing is supported at a defined position in the workpiece carrier.

There are embodiments in which the receiving end itself is rotatably arranged in an opening of the workpiece carrier and there are embodiments in which a workpiece support sleeve is provided at the bearing end, via which the bearing end is received. In this way, it is possible to provide favorable material pairings for the sliding bearing required there between the bearing end and the workpiece carrier. For example, the workpiece support sleeve can form a sliding pairing with the bearing opening of the workpiece carrier, which reduces the sliding resistance in this bearing area.

The above mentioned particularly space-saving arrangement of a large number of workpieces can be realized with a workpiece carrier device in which a plurality of workpiece carriers are arranged relative to one another in such a way that the conical crown arrangements of the workpiece holders of a workpiece carrier embrace the bottom disk of a further workpiece carrier so that the further workpiece holder is largely arranged within a workpiece crown which is formed by the workpieces arranged in the workpiece holders.

The invention also relates to a coating arrangement with a workpiece arrangement according to one of the present claims. It permits batch-wise coating with a large number of workpieces, in which in particular coating properties are improved in an apex area of the individual workpieces.

With reference to FIG. 1, this figure shows a schematic representation of an embodiment of the workpiece carrier device 1 according to the invention. The workpiece carrier device 1 comprises one (or also a plurality of) workpiece carriers 2 having a drive part 1a, which is mounted on a main frame 4 so as to rotate about an axis 3. In this case, a plurality of workpiece holders 5, which are arranged in a ring around the axis 3, are provided, namely along holder axes 6, which are arranged concentrically at a distance from the drive axis/axis 3. In this case, the holder axes 6 are inclined relative to the axis 3 in such a way that the workpiece holders 5 form a conical crown arrangement. The arrangement illustrated in FIG. 1 shows an upwardly extended conical crown arrangement 7. The angle α of the holder axes 6 to the axis 3 is generally formed between 5° and 45°. The workpiece carrier device 1 is here arranged in the coating chamber of a coating arrangement 17. This is where a vacuum coating process can be carried out.

For the drive, the drive part 1a comprises a crank disk 8, which has link slots arranged on its circumference that are designed as oblong holes 9. The link slots 9 are penetrated by the workpiece holders 5 and engage on a crank-like drive portion 10 of the workpiece holder 5. The center of the crank disk 8 is provided with a circular drive opening 11, with which a drive cam 12 circulating eccentrically about the axis meshes. The drive cam 12 is seated in a rotationally fixed manner on a camshaft 13, which turns during operation, i.e. when the workpiece carrier rotates about the axis 3 relative to the workpiece carrier. In this case, it can be designed so as to be rotationally fixed to the main frame or can perform an auto-rotation about its axis relative to the main frame. If necessary, it is here possible to adjust the direction of rotation and speed of rotation of the camshaft 13. The drive cam is provided with a rotatable drive roller 14, which moves in a rolling manner within the drive opening 11 and thereby transmits a wobbling motion to the crank disk 8, which sets the link slots 9 in a corresponding motion, which in this case engage in the drive portions 10 or the cranks of the workpiece holders 5 and set them in a corresponding rotary motion about the holder axis. At the same time, the holder axes move in a circular motion about the axis 3 so that workpieces arranged in the workpiece holders move around the axis 3 so as to rotate about the holder axis and in so doing follow a path through a coating chamber of the coating device 17.

Figure 2:
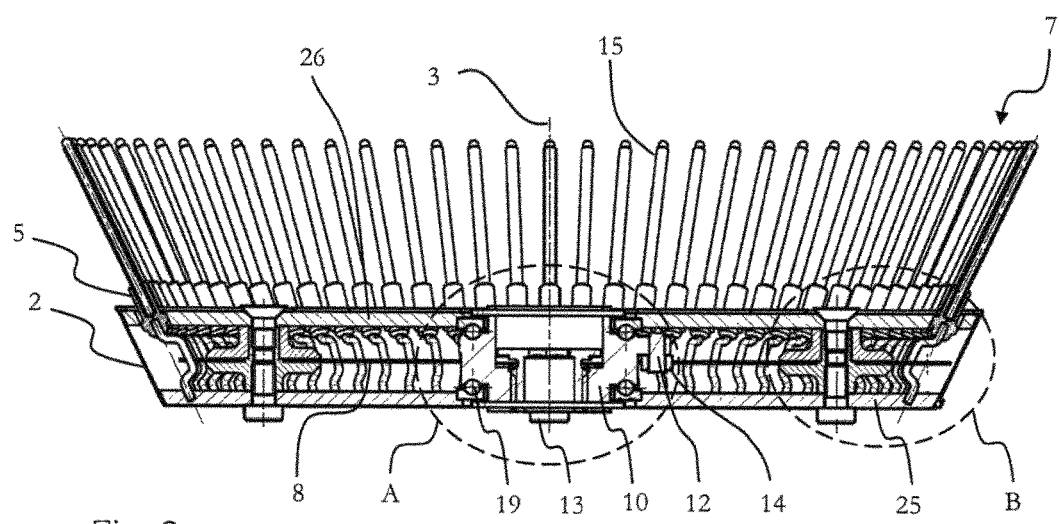
FIG. 2 shows a sectional view of a workpiece carrier device according to the invention correspondent to a first embodiment.

FIG. 2 shows a sectional view of the tool carrier 2 described in connection with FIG. 1, the details of the drive portion 10 with the rolling bearings 19, of the drive cam 12 with the drive roller 14 as well as of the intermediate support plate arrangements 28 for guiding the crank disk 8. The drive cam 12, which is coupled to a camshaft 13, is rotatably mounted to the respective workpiece carrier 2 via the rolling bearings 19.

Figure 2A:
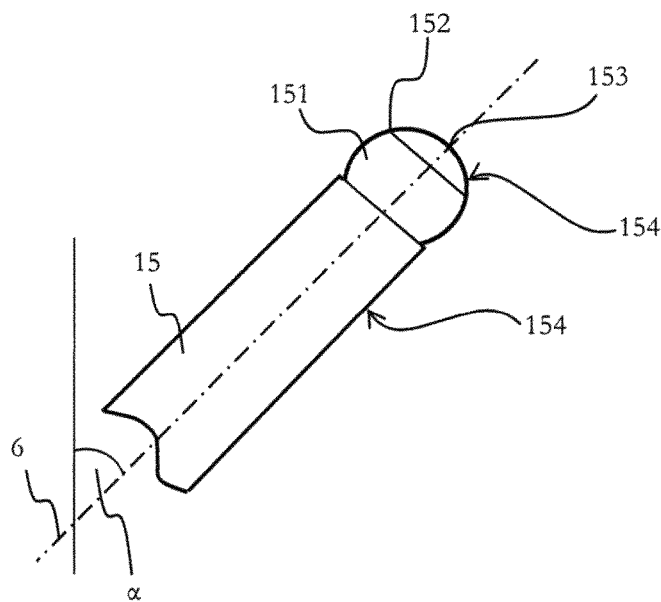
FIG. 2a shows a schematic representation of an upper end of a workpiece in the workpiece holder.

FIG. 2a shows the upper area or tip area (here a sealing head 151) of the workpiece or substrate 15 (here a nozzle needle), the coating of which is particularly critical. During coating, all workpieces 15 rotate about the axis 3 and in each case about the holder axes 6 running through the workpiece 15. Due to the inclination of the holder axes 6 relative to the axis 3 by the angle α, there is an apex zone 152, which is arranged along a ring running concentrically to the holder axis 6 in such a way that when rotating about the holder axis 6 along the apex zone 152 (ring) a relative apex moves cyclically up and down from the uppermost point along the circle or about the holder axis 6. The absolute apex 153 or pole with respect to the holder axis 6 is laterally below the highest apex. The arrangement inclined by the angle α causes, during coating, the entire apex zone 152, including the absolute apex 153, to be coated very uniformly, which is particularly important for the sealing function of the sealing head 151.

The same applies to an embodiment in which instead of a spherical sealing head 151 at the end of the workpiece a sealing cone is formed, the tip of which can also be spherically rounded. Such an embodiment also ensures a particularly uniform coating of the cone flanks and the cone tip area.

Thanks to the angle of inclination α and the rotation about both the axis 3 and also the respective holder axes 6, such nozzle needles or injection pins 15 can be homogeneously coated. In particular, the poles or the apices or apex zones 151 and the circumferential surfaces or the equator area of such a sphere are uniformly wetted by the coating material. In contrast thereto, only the equator zones are coated in an acceptable way in the case of vertically running holder axes.

Typically, coating materials of a coating 154 for workpieces or substrates 15, such as injection pins or nozzle needles (e.g., pin, injection pin, ball, ball pin, piston, nozzle needle, etc.) typically comprise CrN/CrC as a functional layer or in a multi-layered coating in a layer thickness of 0.1 μm-10 μm and a second diamond-like carbon layer which is applied as a cover layer and has a thickness of 0.1-10 μm. In this connection, amorphous carbon layers a-C:H/a-C:H:Me/a-C:H:X (hydrogen-containing amorphous carbon layers) or ta-C (tetrahedrally hydrogen-free amorphous carbon layer) are realized.

a-C:H:Me [metal-doped:tungsten; Cu; or other]

a-C:H:X [doped with silicon, oxygen, nitrogen or other]

In general, all PVD layers as well as gas and plasma nitriding applications can be used with this device up to 450° C.

Figure 3:
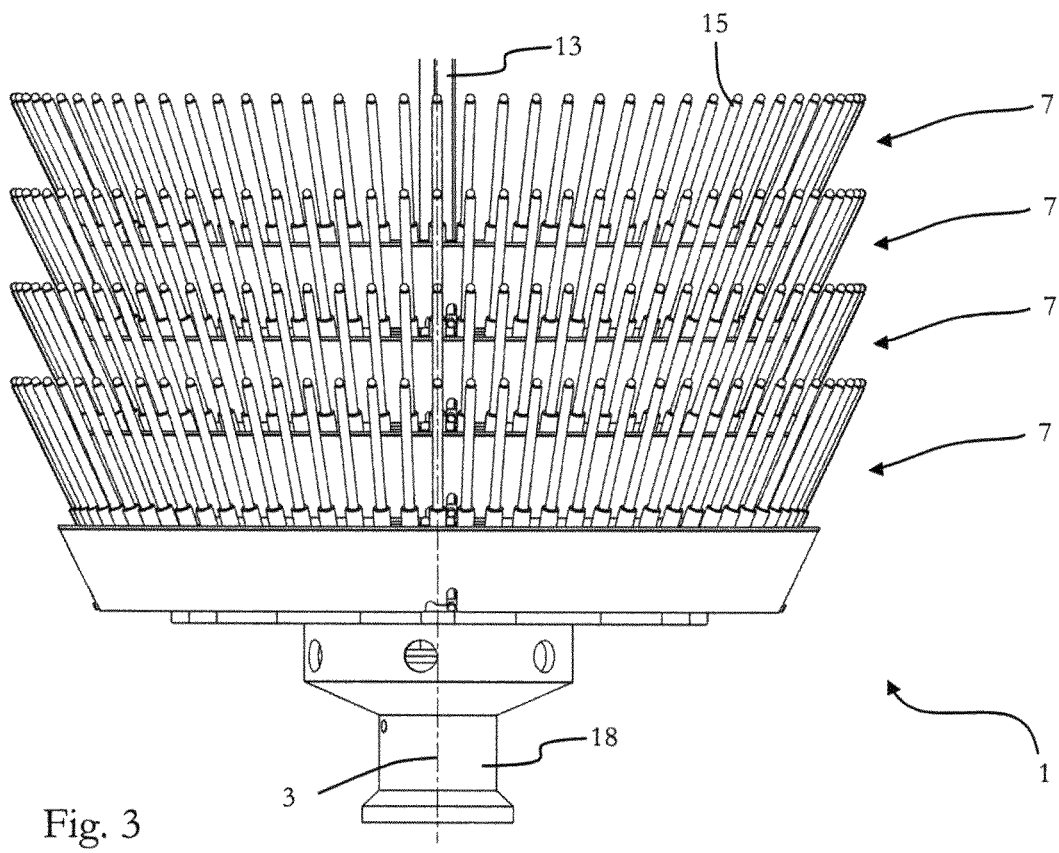
FIG. 3 shows a side view of a workpiece carrier device according to the invention that has multiple workpiece holders.

FIG. 3 shows a workpiece carrier device in which a plurality of workpiece carriers 2 are arranged so as to be nested, wherein the conical crown arrangements 7 of a lower workpiece holder embrace a workpiece holder 5 arranged above them. The workpiece holders are here set in rotation by means of a drive foot 18.

The design of the workpiece holders is shown in FIG. 4. It comprises a crank portion which is used as a drive portion 10 and which is arranged between a bearing end 20 and a receiving end 21 so as to be bent in a crank-like manner. On the receiving end 21 there is seated a workpiece support sleeve 22, into the receiving opening of which workpieces can be inserted. FIGS. 2, 2a and 3 show pin-like workpieces 24, e.g. nozzle needles or injection pins.

FIG. 6 (detail A from FIG. 3) shows an embodiment of the drive cam 12, which is arranged via radial bearings 19 between the bearing disk 26 and the cover disk 27 so that it can rotate relative to the workpiece carrier 2. A drive roller 32 is arranged on an eccentric area 30 via a pin 31 and circulates in the drive opening 11 of the crank disk 8 and sets it in corresponding crank movements about the axis 3, via which the workpiece holders 5 are set in rotation. Here, the workpiece carrier 2 rotates relative to the drive cam 12, which is fixed or turned via the camshaft 13 relative to the workpiece holder 5.

FIG. 7 (detail B from FIG. 2) shows the action of the crank disk 8 on the workpiece holder 5. The wobbling motion of the crank disk 8 relative to the tool holder 5 causes a corresponding movement of the link slots 9, which engage on the drive portion 10 of the workpiece holder 5, and which, as a result, is set in a rotary motion about the holder axis 6 by following the wobbling motion. In this case, the bearing end 20 is mounted in a bottom disk 25 of the workpiece carrier 2 and the receiving end 21 is mounted via the workpiece support 22 in a bearing disk 26, which is additionally covered by a cover disk 27.

In order to stabilize the crank disk 8 in its plane of movement (perpendicular to the axis 3), support plate arrangements 28 are provided, which define guide slots 29, in which guide openings 30 of the crank disk are located. The diameters of the guide opening 29 and the support plate arrangement 28 are matched to the wobbling motion of the crank disk 8 so as to ensure that the support plate arrangements 28 always include the edge of the guide opening 29. The support plate arrangements 28 are fixed by means of screws 32 passing through the workpiece carrier 2 and the guide opening 29.

This relative movement can be controlled by means of the shaft 13, which passes through the drive cam 12 in a rotationally fixed manner. The drive cam can, for example, be adjusted so as to be rotationally fixed relative to the main frame. However, it can also be turned in the opposite direction to the rotary motion of the workpiece carrier 2 to thus increase the rotational speed of the workpiece holders.

The flow diagram shown in FIG. 8 of a method according to the invention for coating workpieces or substrates 15 formed e.g. as jet needles, comprises the steps of:
  A providing a workpiece carrier device 1,
  B arranging substrates 15 in workpiece holders 22,
  C moving and rotating the workpiece holders 22 or the substrates 15 in a coating arrangement 17
  D coating the substrates 15, and
  E removing the coated substrates 15.

Further details and variants of the invention will be apparent to a person skilled in the art within the scope of the claims.

REFERENCE SIGNS 1 workpiece carrier device
1a drive part
2 workpiece carrier
3 axis
4 main frame
5 workpiece holder
6 holder axes
7 conical crown arrangement
8 crank disk
9 link slots/oblong holes
10 drive portion, crank portion
11 drive opening
12 drive cam
13 cam shaft
14 drive roller
15 workpiece, substrate (e.g. pin, injection pin, ball, ball pin, piston, nozzle needle, etc.)
17 coating arrangement
18 drive foot
19 rolling bearing
20 bearing end
21 receiving end
22 workpiece support (sleeve)
25 bottom disk
26 bearing disk
27 cover disk
28 support plate arrangement
29 guide opening
30 slot
31 eccentric area
32 screw
151 tip area, sealing head
152 apex zone
153 absolute apex
154 coating

The invention claimed is:

1. A workpiece carrier device for holding and moving workpieces having:
  a workpiece carrier for receiving workpieces, which is mounted on a main frame so as to rotate about an axis,
  a drive part, which can likewise rotate about the axis relative to the workpiece carrier, and
  multiple workpiece holders, which are arranged on the workpiece carrier in a ring around the axis and are mounted on the workpiece carrier so as to rotate about holder axes which are spaced from the axis,
  wherein the holder axes run in relation to the axis in such a way that the workpiece holders and/or the workpieces arranged in the workpiece holders form a conical crown arrangement and
  wherein the drive part comprises a crank disk with link slots, wherein the link slots are designed as elongate oblong slots that are oriented radially to the axis, and which are arranged on the circumference and in each of which a drive portion of the workpiece holder runs, via which during operation the workpiece holders are set in a rotary motion,
  wherein each of the workpiece holders is designed in a crank-like fashion and comprises a crank portion which runs between two coaxially extending end portions, one of which is rotatably mounted as a bearing end in a bearing point of the workpiece carrier and the other of which is rotationally arranged as a receiving end in a bearing opening of the workpiece carrier,
  wherein the crank portion forms the drive portion that interacts with the link slots and that, during the drive of the crank disk, performs a reciprocating movement in these link slots and thereby exerts a rotary movement about the holder axes, and
  wherein a support plate arrangement is provided, the support plate arrangement comprising guide slots fixed to the workpiece carrier, wherein a guide opening of the crank disc is located in each of the guide slots, and wherein said support plate arrangement is configured to stabilize the crank disc in a plane of movement.

2. The workpiece holder device according to claim 1, wherein the holder axes form an angle of between 5° and 45° with the axis.

3. The workpiece carrier device according to claim 1, wherein a drive cam which can rotate relative to the crank disk engages in a circulatory manner in a drive opening of the crank disk and, during operation, moves the crank disk normal to the axis and in this way carries out the rotary motion of the workpiece holder via the link slots.

4. The workpiece carrier device according to claim 3, wherein the drive cam exerts its driving action via a drive roller, which is rotatably mounted eccentrically to the axis and which rolls on the edge of the drive opening during operation.

5. The workpiece carrier device according to claim 1, wherein the bearing point is arranged in a bottom disk of the workpiece carrier.

6. The workpiece carrier device according to claim 1, wherein the bearing end is mounted via a workpiece support sleeve, which is arranged at the receiving end.

7. The workpiece carrier device according to claim 1, wherein multiple workpiece carriers arranged relative to one another in such a way that the conical crown arrangements of the workpiece holders of a workpiece carrier embrace the bottom disk of a further workpiece holder so that the further workpiece holders are largely arranged within a workpiece crown which is formed by workpieces arranged in the workpiece holders.

8. A coating arrangement having a workpiece carrier device according to claim 1.

9. A method for coating substrates including:
providing a workpiece carrier device according to claim 1;
arranging substrates in workpiece holders;
moving and rotating the workpiece holders in a coating arrangement;
depositing a coating on the substrates; and
removing the coated substrates.

10. A substrate having a coating, which is applied according to the method of claim 9, wherein the substrate has a tip area which has a flat, roof- or dome-shaped, spherical and/or conical form.

11. The substrate according to claim 10, wherein the coating has at least a first layer which comprises a metal nitride and/or a metal carbide, and the coating preferably has at least a second layer, wherein the second layer is preferably an amorphous carbon layer which comprises a ta-C and/or an a-C:H and/or an a-C:H:Me and/or an a-C:H:X and/or an a-C:H:Me:X material, wherein Me is or comprises preferably tungsten or copper, and X preferably is or comprises silicon or nitrogen or oxygen, wherein a:C:H:Me denotes an amorphous carbon layer material doped with Me and a:C:H:X denotes an amorphous carbon layer material doped with X and a:C:H:Me:X denotes an amorphous carbon layer material doped with Me and X.

12. The substrate according to claim 11, wherein the coating comprises both a first layer and a second layer, wherein the first layer preferably comprises CrN and/or CrC and the second layer preferably comprises ta-C and/or a-C:H and/or a-C:H:Me and/or a-C:H:X and/or a-C:H:Me:X.

13. The substrate according to claim 11, wherein the coating comprises both a first layer and a second layer, wherein the first layer preferably comprises TiN and/or TiN and the second layer preferably comprises ta-C and/or a-C:H and/or a-C:H:Me and/or a-C:H:X and/or a-C:H:Me:X.

14. The substrate according to claim 11, wherein the coating is designed as a multi-layered coating system which comprises two or more layers, wherein the coating comprises both a first layer and a second layer and the second layer is preferably deposited as an outer layer and the first layer is preferably deposited between the substrate and the second layer.

15. The substrate according to claim 10, which is designed as one of the following components: pin, injection pin, ball-ball pin, piston, nozzle needle.

16. A workpiece carrier device for holding and moving workpieces having:
a workpiece carrier for receiving workpieces, which is mounted on a main frame so as to rotate about an axis,
a drive part, which can likewise rotate about the axis relative to the workpiece carrier, and
multiple workpiece holders, which are arranged on the workpiece carrier in a ring around the axis and are mounted on the workpiece carrier so as to rotate about holder axes which are spaced from the axis,
wherein the holder axes run in relation to the axis in such a way that the workpiece holders and/or the workpieces arranged in the workpiece holders form a conical crown arrangement and
wherein the drive part comprises a crank disk with link slots, wherein the link slots are designed as elongate oblong slots that are oriented radially to the axis, and which are arranged on the circumference and in each of which a drive portion of the workpiece holder runs, via which during operation the workpiece holders are set in a rotary motion,
wherein each of the workpiece holders is designed in a crank-like fashion and comprises a crank portion which runs between two coaxially extending end portions, one of which is rotatably mounted as a bearing end in a bearing point of the workpiece carrier and the other of which is rotationally arranged as a receiving end in a bearing opening of the workpiece carrier,
wherein the crank portion forms the drive portion that interacts with the link slots and that, during the drive of the crank disk, performs a reciprocating movement in these link slots and thereby exerts a rotary movement about the holder axes,
wherein a drive cam which can rotate relative to the crank disk engages in a circulatory manner in a drive opening of the crank disk and, during operation, moves the crank disk normal to the axis and in this way carries out the rotary motion of the workpiece holder via the link slots, and
wherein the drive cam exerts its driving action via a drive roller, which is rotatably mounted eccentrically to the axis and which rolls on the edge of the drive opening during operation.

17. The workpiece holder according to claim 16, wherein a support plate arrangement is provided, the support plate arrangement comprising guide slots fixed to the workpiece carrier, wherein a guide opening of the crank disc is located in each of the guide slots, and wherein said support plate arrangement is configured to stabilize the crank disc in a plane of movement.

18. The workpiece holder device according to claim 16, wherein the holder axes form an angle of between 5° and 45° with the axis.

19. The workpiece carrier device according to claim 16, wherein the bearing point is arranged in a bottom disk of the workpiece carrier.

20. The workpiece carrier device according to claim 16, wherein the bearing end is mounted via a workpiece support sleeve, which is arranged at the receiving end.

21. The workpiece carrier device according to claim 16, wherein multiple workpiece carriers arranged relative to one another in such a way that the conical crown arrangements of the workpiece holders of a workpiece carrier embrace the bottom disk of a further workpiece holder so that the further workpiece holders are largely arranged within a workpiece crown which is formed by workpieces arranged in the workpiece holders.

* * * * *